United States Patent
Chen et al.

(10) Patent No.: US 6,251,219 B1
(45) Date of Patent: Jun. 26, 2001

(54) METHOD AND APPARATUS FOR USE IN ASSEMBLING ELECTRONIC DEVICES

(75) Inventors: Philip H. Chen, Tualatine, OR (US); Dennis M. Gibson, Lake Jackson, TX (US); Cuong Van Pham, Belleville, MI (US)

(73) Assignee: Intermedics Inc., Angleton, TX (US)

( * ) Notice: Subject to any disclaimer, the term of this patent is extended or adjusted under 35 U.S.C. 154(b) by 0 days.

(21) Appl. No.: 09/160,202

(22) Filed: Sep. 17, 1998

(51) Int. Cl.[7] .................................................. H05K 3/30
(52) U.S. Cl. ........................ 156/556; 156/299; 29/740; 29/832; 269/21
(58) Field of Search ........................ 29/740, DIG. 1, 29/832; 156/299, 83, 556, 560, 562; 438/118; 269/13, 21

(56) References Cited

U.S. PATENT DOCUMENTS

| | | | |
|---|---|---|---|
| 4,015,764 | 4/1977 | Durney | 227/118 |
| 4,063,050 | 12/1977 | Carlson et al. | 179/111 E |
| 4,127,432 | 11/1978 | Kuwano et al. | 156/297 |
| 4,283,847 | 8/1981 | May | 29/832 |
| 4,451,324 * | 5/1984 | Ichikawa et al. | 156/562 |
| 4,474,639 | 10/1984 | Fritz | 156/556 |
| 4,489,487 | 12/1984 | Bura | 29/840 |
| 4,667,868 | 5/1987 | Decker et al. | 228/49.1 |
| 4,783,695 | 11/1988 | Eichelberger et al. | 357/65 |
| 4,785,936 | 11/1988 | Shpigelman | 206/454 |
| 4,881,356 | 11/1989 | Beezer et al. | 53/53 |
| 4,908,092 | 3/1990 | Koibuchi | 156/556 |
| 4,918,811 | 4/1990 | Eichelberger et al. | 29/840 |
| 4,959,749 | 9/1990 | Dzarnoski, Jr. et al. | 361/396 |
| 4,980,002 | 12/1990 | Dzarnoski, Jr. et al. | 156/64 |
| 4,985,107 * | 1/1991 | Conroy et al. | 156/299 |
| 4,990,462 | 2/1991 | Sliwa, Jr. | 437/51 |
| 4,999,311 | 3/1991 | Dzarnoski, Jr. et al. | 437/51 |
| 5,058,721 | 10/1991 | Koibuchi | 198/345.1 |
| 5,075,253 | 12/1991 | Sliwa, Jr. | 437/209 |
| 5,135,098 | 8/1992 | Koibuchi | 198/345.1 |
| 5,136,238 | 8/1992 | Kade | 324/158 F |
| 5,138,430 | 8/1992 | Gow, 3rd et al. | 357/70 |
| 5,144,747 | 9/1992 | Eichelberger | 29/839 |
| 5,158,640 | 10/1992 | Akiyama et al. | 156/542 |
| 5,161,984 | 11/1992 | Taylor et al. | 439/73 |
| 5,218,753 | 6/1993 | Suzuki et al. | 29/740 |
| 5,221,215 | 6/1993 | Tan et al. | 439/620 |
| 5,250,843 | 10/1993 | Eichelberger | 257/692 |
| 5,362,681 | 11/1994 | Roberts, Jr. et al. | 437/226 |
| 5,366,906 | 11/1994 | Wojnarowski et al. | 437/8 |

(List continued on next page.)

OTHER PUBLICATIONS

U.S. Ser. No. 09/154810 (Ulmer et al., Method and Apparatus for Use In Assembling Electronic Devices, filed Sep. 17, 1998).*

Zarrow, Phil, "Printing", Special Supplement, SMT (Surface Mount Technology), Jul. 1998, pp. 16–19.

van der Bosch, Ann; DeBarros, Toney; "Adhesives/Epoxies and Dispensing", Special Supplement, SMT (Surface Mount Technology), Jul. 1998, pp. 20–25.

*Primary Examiner*—Michael W. Ball
*Assistant Examiner*—Jessica Rossi
(74) *Attorney, Agent, or Firm*—Schwegman, Lundberg, Woessner & Kluth, P.A.

(57) ABSTRACT

A fixture holds a plurality of circuit components backside up in a substantially coplanar relationship in the same spatial relationship between the circuit components that the components are intended to have a circuit board or substrate as part of an electronic device. An adhesive applying device, such as a screen printer, applies adhesive to the backside of each circuit component. The circuit components may then be transferred onto a substrate by the use of a piston transfer device, for instance. Preferably, all the circuit components are transferred substantially simultaneously.

22 Claims, 5 Drawing Sheets

U.S. PATENT DOCUMENTS

| | | | |
|---|---|---|---|
| 5,367,766 | 11/1994 | Burns et al. | 29/848 |
| 5,424,918 | 6/1995 | Felps et al. | 361/704 |
| 5,437,041 | 7/1995 | Wakabayashi et al. | 395/800 |
| 5,446,620 | 8/1995 | Burns et al. | 361/704 |
| 5,504,988 | 4/1996 | Avery et al. | 29/741 |
| 5,550,711 | 8/1996 | Burns et al. | 361/728 |
| 5,581,443 | 12/1996 | Nakamura et al. | 361/705 |
| 5,615,086 | 3/1997 | Collins et al. | 361/704 |
| 5,620,927 | 4/1997 | Lee | 29/841 |
| 5,642,261 | 6/1997 | Bond et al. | 361/704 |
| 5,659,459 | 8/1997 | Wakabayashi et al. | 361/753 |
| 5,667,129 | 9/1997 | Morita et al. | 228/102 |
| 5,670,009 * | 9/1997 | Tarn et al. | 156/299 |
| 5,708,297 | 1/1998 | Clayton | 257/723 |
| 5,731,633 | 3/1998 | Clayton et al. | 257/723 |
| 5,751,553 | 5/1998 | Clayton | 361/749 |
| 5,875,068 | 2/1999 | Sawada | 360/99.01 |
| 5,881,453 | 3/1999 | Avery et al. | 29/834 |
| 5,953,588 | 9/1999 | Camien et al. | 438/106 |
| 5,959,840 | 9/1999 | Collins et al. | 361/713 |
| 5,983,644 | 11/1999 | Bolandi et al. | 62/3.2 |

* cited by examiner

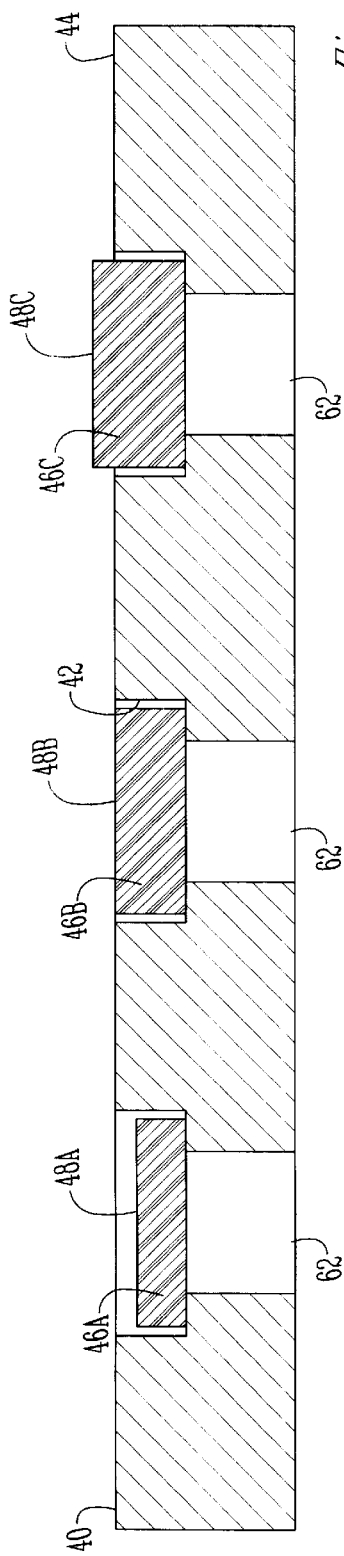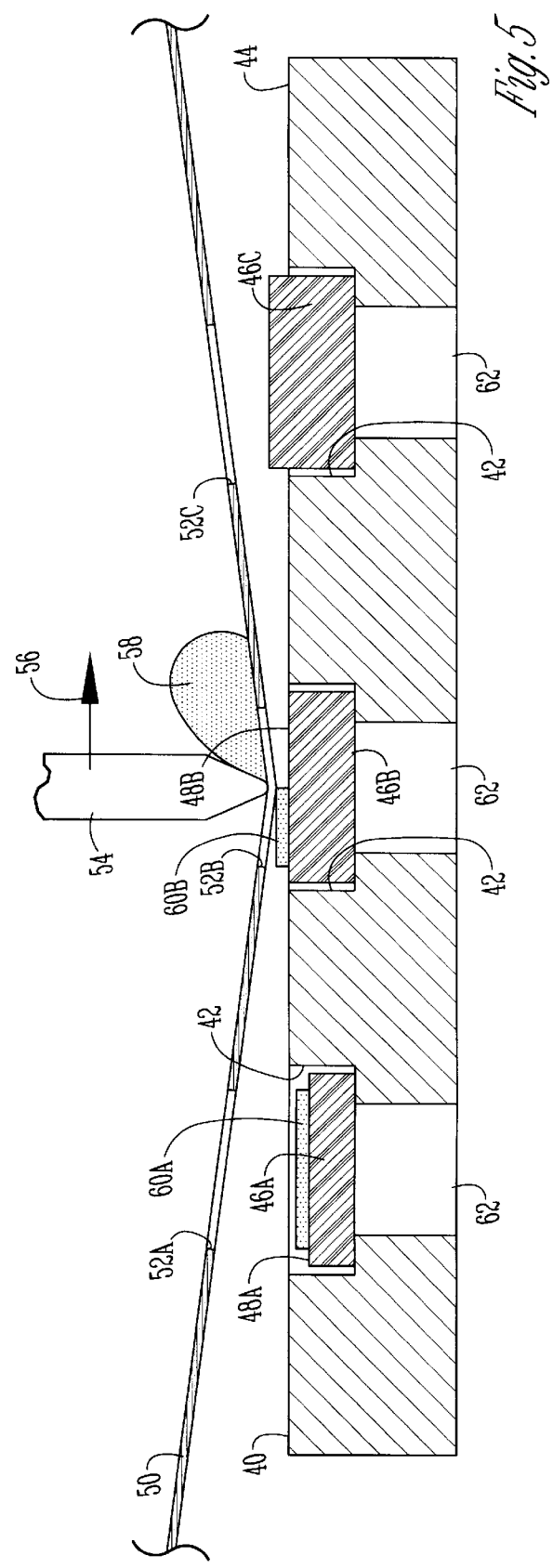

METHOD AND APPARATUS FOR USE IN ASSEMBLING ELECTRONIC DEVICES

CROSS-REFERENCE TO RELATED APPLICATIONS

The present invention is related to the following application which is incorporated herein by reference:

U.S. patent application Ser. No. 09/154,810, filed Sep. 17, 1998, titled "METHOD AND APPARATUS FOR USE IN ASSEMBLING ELECTRONIC DEVICES".

FIELD OF THE INVENTION

The present invention relates generally to circuit fabrication and, more particularly, to methods and apparatus for coupling integrated circuit chips and the like to a substrate.

BACKGROUND OF THE RELATED ART

In the fabrication of electrical circuits, it is often desirable to couple a circuit component to a substrate. For instance, one particular example involves the coupling of an integrated circuit chip to a ceramic substrate or to a printed circuit board. Although various techniques exist, adhesives are widely used to couple circuit components to substrates.

Conventional fabrication techniques apply adhesive to the substrate. The circuit components are then placed onto the adhesive on the substrate. One popular and very efficient method for applying adhesive onto a substrate is referred to as a screen printing process. In a screen printing process, a screen that is generally impermeable to adhesive has adhesive placed on it. The screen includes a pattern of holes formed in it, and these holes correspond to desired locations of circuit components on the substrate. When the screen pattern is placed over the substrate, a squeegee moves along the screen and over the holes, so that the adhesive passes through the holes and onto the underlying substrate.

The screen printing process works quite well on substrates that are substantially flat, and it provides a relatively flat adhesive patch that corresponds to the shape of the circuit component to be placed on the substrate. However, the screen printing process does not work well on multi-level substrates or on substrates that include ridges or cavities. On substrates with such surface irregularities, it is difficult for the screen to remain in contact with the substrate as the squeegee passes over the screen. As a result, the adhesive may not be properly transferred from the screen to the substrate.

To deposit adhesive on non-flat substrates, dispensing machines are typically used. Dispensing machines use a plurality of needles to dispense drops of adhesive onto a substrate at the desired locations. Although dispensing machines are able to deposit adhesive on non-flat substrates, such machines unfortunately exhibit various other disadvantages. First, dispensing machines deposit drops of adhesive, rather than carefully formed and relatively flat adhesive patterns such as those produced by screen printing. When circuit components are placed on these drops, the adhesive may not distribute evenly between the component and the substrate. Second, dispensing machines are relatively slow compared to screen printing machines. As is well known, slower techniques tend to limit throughput and increase manufacturing costs. Third, certain very desirable adhesives cannot be dispensed by dispensing machines due to their physical and/or chemical properties.

The present invention may address one or more of the problems discussed above. The invention further develops the invention of Ulmer and Pham, "Method and Apparatus for Use in Assembling Electronic Devices", U.S. application Ser. No. 09/154,810, which is also assigned to the assignee of this invention. This disclosure of that application is incorporated herein by reference.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, there is provided an apparatus for use in assembling an electronic device. The apparatus includes a fixture that has a substantially regular surface. The substantially regular surface has a plurality of recesses therein. Each of the plurality of recesses are sized to accept a circuit component placed backside up therein such that the backside of the circuit component forms a portion of the substantially regular surface.

In accordance with another aspect of the present invention, there is provided an apparatus for use in assembling an electronic device. The apparatus includes a fixture that has a first surface and a second surface. The first surface has a plurality of holders. Each of the plurality of holders are sized to accept a circuit component placed backside up therein such that the backside of each circuit component is placed in a substantially coplanar relationship.

In accordance with still another aspect of the present invention, there is provided an apparatus for use in assembling an electronic device. The apparatus includes a fixture that has a first surface and a second surface. The first surface is substantially regular and has a plurality of recesses therein. Each of the plurality of recesses is sized to accept a circuit component placed backside up therein such that the backside of each circuit component is placed in a substantially coplanar relationship. A transfer device transfers the circuit components from the fixture to a substrate. The transfer device may include a plurality of pistons. Each piston is located proximate a respective hole in the fixture. Each respective piston is extendable and is sized to pass through the respective hole to engage the respective circuit component in the respective recess and to transfer the respective circuit component from the fixture to the substrate.

In accordance with yet another aspect of the present invention, there is provided an apparatus for use in assembling an electronic device. The apparatus includes a fixture that has a first surface and a second surface. The first surface is substantially regular and has a plurality of recesses therein. Each of the plurality of recesses is sized to accept a circuit component placed backside up therein such that the backside of each circuit component is placed in a substantially coplanar relationship. A device, such as a screen printer, applies adhesive to the backside of each of the circuit components in the fixture.

In accordance with a further aspect of the present invention, there is provided an apparatus for use in assembling an electronic device. The apparatus includes: means for holding a plurality of circuit components backside up such that the backside of each circuit component is placed in a substantially coplanar relationship; means for applying adhesive to the backside of each of the circuit components;

and means for transferring each of the circuit components from the holding means to a substrate.

In accordance with an even further aspect of the present invention, there is provided a method of assembling an electronic device. The method includes the acts of: (a) holding a plurality of circuit components backside up such that the backside of each circuit component is placed in a substantially coplanar relationship; (b) applying adhesive to the backside of each of the circuit components; and (c) transferring each of the circuit components to a substrate.

BRIEF DESCRIPTION OF THE DRAWINGS

The foregoing and other advantages of the invention will become apparent upon reading the following detailed description and upon reference to the drawings in which:

FIG. 4 illustrates a cross-sectional view of the fixture of FIG. 3 taken along line 4—4, along with circuit components disposed in the recesses of the fixture;

FIG. 5 illustrates the cross-sectional view of FIG. 4 during a screen printing process;

DESCRIPTION OF SPECIFIC EMBODIMENTS

As discussed in detail below in conjunction with the drawings, the methods and apparatus for assembling electronic devices may be used on a variety of regular or irregular substrates. However, a cardiac stimulator is presented below as one example of an electronic device that may benefit from the method and apparatus disclosed herein. As is well known, a cardiac stimulator is a medical device used to facilitate heart function. For instance, if a person's heart does not beat properly, a cardiac stimulator may be used to provide relief. The cardiac stimulator delivers electrical stimulation to a patient's heart to keep it beating properly. In fact, cardiac stimulators generally fall into two categories, pacemakers and defibrillators, although some cardiac stimulators may perform both functions. Pacemakers supply electrical pulses to the heart to keep the heart beating at a desired rate, while defibrillators supply a relatively large electrical pulse to the heart to help the heart recover from cardiac failure.

Figure 1:
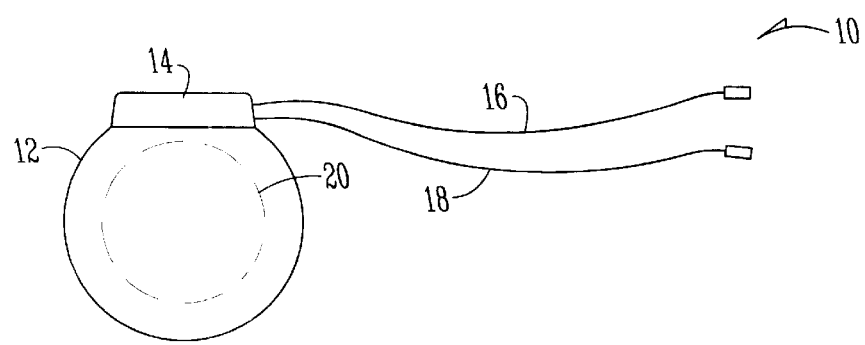
FIG. 1 illustrates a cardiac stimulator.

Turning now to the drawings, and referring initially to FIG. 1, a cardiac stimulator is illustrated and generally designated by a reference numeral 10. The body of the cardiac stimulator 10 typically includes a case 12 and a header 14. One or more leads, such as an atrial lead 16 and a ventricular lead 18, are typically coupled to the header 14 to transmit electrical stimulation pulses to the patient's heart. The electrical stimulation pulses are generated by electronic circuitry 20 contained within the case 12 of the cardiac stimulator 10. The cardiac stimulator 10 also uses the electronic circuitry 20 to perform its other functions, so the circuitry 20 typically includes a microprocessor that is coupled to a variety of circuits, such as a memory, stimulus generators, and sense circuits.

Figure 2:
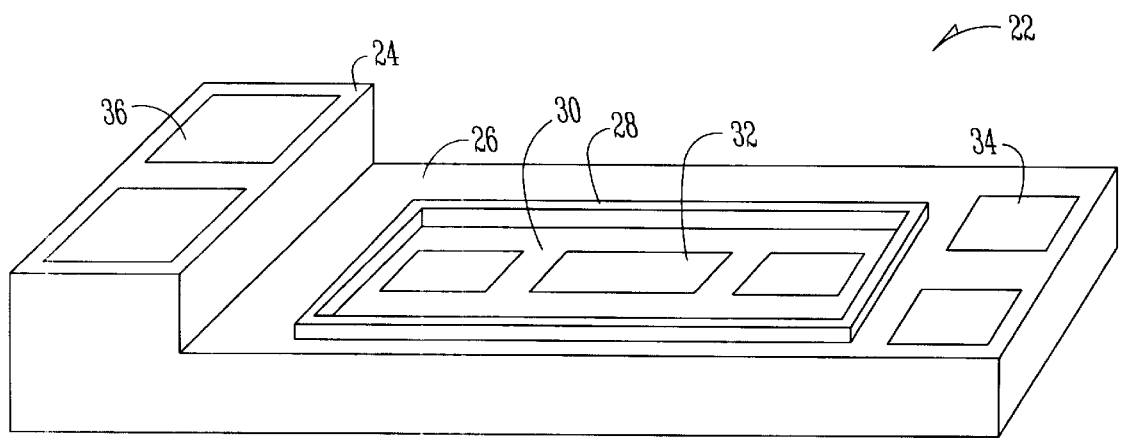
FIG. 2 illustrates a perspective view of a portion of an uneven substrate.

The microprocessor and related circuitry are typically mounted on a substrate. A portion of one such substrate is illustrated in FIG. 2 and designated by the reference numeral 22. As mentioned previously, certain substrates include multiple levels, ridges, or cavities. The exemplary portion of the substrate 22 features a multi-level surface that includes an upper surface 24 and a lower surface 26. The lower surface 26 features a ring 28 that extends upwardly from the surface 26 effectively to define a cavity 30 on the lower surface 26.

Circuit components 32 may be mounted within the cavity 30 to isolate them from other circuit components 34 and 36. For example, the circuit components 32 may be more sensitive to environmental conditions than the circuit components 34 and 36. Accordingly, the circuit components 32 may be mounted within the cavity 30 so that they may be hermetically sealed, while leaving the circuit components 34 and 36 unsealed.

As discussed previously, known screen printing techniques are relatively ineffective on substrates having irregular surfaces, such as the substrate 22, and the use of dispensing machines has a number of drawbacks. To address these concerns, it has been determined that a rather conventional screen printing process may be used to apply adhesive to the circuit components rather than to the substrate. Once the adhesive has been applied to the circuit components, the circuit components may be transferred to the substrate for mounting in the desired locations.

Figure 3:
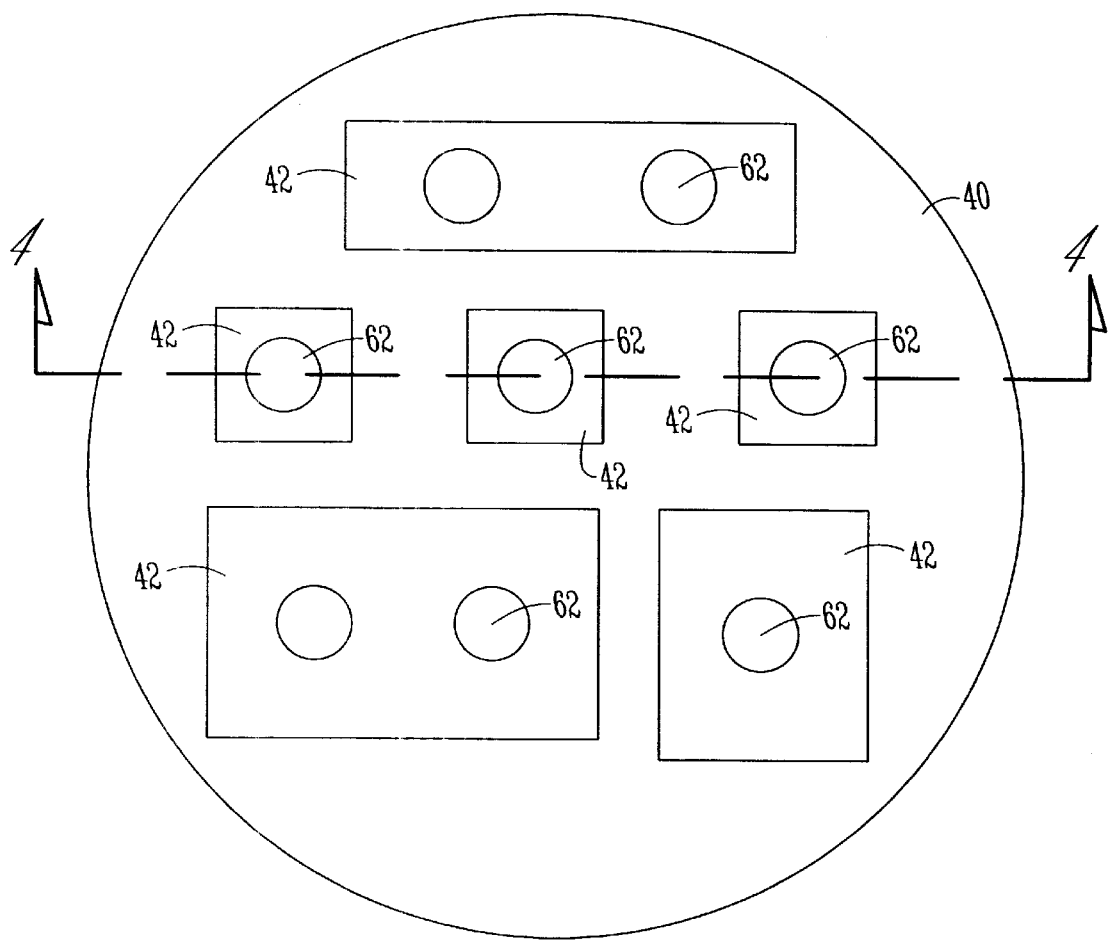
FIG. 3 illustrates a top view of an exemplary fixture in accordance with the present invention.

To facilitate the use of a screen printing process for applying adhesive to circuit components, a fixture is provided for holding the circuit components during the screen printing process. One example of a fixture is illustrated in FIG. 3 and designated by the reference numeral 40. The fixture 40 may be made out of any suitable material. For instance, it may be advantageous for the fixture to protect circuit components such as chips and surface mount packages. Accordingly, the fixture 40 may be made of a material that dissipates static electricity, such as anodized aluminum or conductive plastic. Alternatively, other materials, such as stainless steel, ceramic, glass, or polymers, may be appropriate in certain circumstances. Additionally, it may be advantageous to make the fixture 40 from a material that is machinable or moldable.

Referring also to the cross-sectional view of the fixture 40 illustrated in FIG. 4, it can be seen that the fixture 40 has a relatively smooth and regular surface 44, although the fixture 40 advantageously includes one or more recesses 42 that are sized to accept the particular circuit components 46. Precise placement of the circuit components 46 within the recesses 42 is important, both so that adhesive can be accurately applied to the compents and so that the components can be inverted into a complementary fixture without adhering to the complimentary fixture. Both of these steps will be described in more detail below. Preferably, however, the opening of a recess should be no more than 0.5 mil (0.01 mm) larger than the associated component in any linear direction in the plane of the regular surface 44. The circuit components 46 reside within the recesses 42 so that they essentially form a portion of the substantially regular surface of the fixture 40. Ideally, the exposed surfaces 48 of the circuit components 46 are disposed in a coplanar relationship with the surface 44 of the fixture 40, as illustrated by the circuit component 46b. However, the exposed surfaces of the circuit components 46 may also be slightly offset with respect to the surface 44 of the fixture 40 to provide at least a substantially coplanar relationship, depending upon the tolerance of the screen printing process to be used. For example, the surface 48a of the circuit component 46a is slightly recessed relative to the surface 44 of the fixture 40, while the surface 48c of the circuit component 46c is slightly raised with respect to the surface 44 of the fixture 40. Generally speaking, a tolerance of +/−0.002 to +/−0.005 inches (+/−0.05 to +/−0.12 mm) is acceptable for most screen printing processes.

The circuit components 46 are positioned upside down in the fixture 40 so that the adhesive may be applied to the backside of the circuit components 46. Once the circuit components 46 have been inserted into the fixture 40, the fixture 40 is positioned underneath a screen 50 of a screen printer. As illustrated in FIG. 5, the screen includes holes 52a, 52b, and 52c that are positioned over the circuit components 46a, 46b, and 46c, respectively. As the squeegee 54 moves in the direction of the arrow 56, it brings the screen 50 into closer proximity with the exposed surfaces 48 of the circuit components 46 while it moves the selected adhesive material 58 along the screen 50. In this example, a layer of adhesive 60a is illustrated as being deposited on the exposed surface 48a of the circuit component 46a, and a second layer of adhesive 60b is in the process of being deposited on the exposed surface 48b of the circuit component 46b.

It should be appreciated that if the circuit components 46 are not held within the recesses 42 during the screen printing process that the application of adhesive may tend to pull the circuit components 46 out of the recesses 42. Accordingly, it is advantageous to provide a means of holding the circuit components 46 within the recesses 42 of the fixture 40. In the illustrated embodiment, each recess 42 is provided with one or more holes 62 which extend between the bottom of the recess 42 and the bottom of the fixture 40. A vacuum may be applied through the holes 62 to hold the circuit components 46 within the recesses 42 during the screen printing process. Although the use of the holes 62 provides additional advantages which are discussed below, other suitable means for holding the circuit components 46 within the recesses 42 may also be employed. For instance, a tacky substance, such as gel coat, may be disposed in the recesses 42 to hold the circuit components 46 temporarily during the application of adhesive.

Once the adhesive has been applied to the circuit components 46, the circuit components 46 may be transferred to the surface of the substrate 22. For example, a pick and place device may be used to transfer the circuit components 46 from the fixture 40 to the substrate 22. In this example, the pattern of recesses 42 on the fixture 40 need not correspond to the desired pattern of circuit components on the substrate 22. Unfortunately, a pick and place device typically transfers only one circuit component at a time. Alternatively, and particularly if the circuit components 46 are temporarily held within the recesses 42 by a tacky substance, the fixture 40 may be clamped to the substrate 22 until the adhesive cures. This technique has the advantage of transferring all of the circuit components simultaneously, but the substrate should be relatively regular to ensure proper bonding.

More advantageous than these techniques, however, a means may be used to remove the circuit components 46 from the fixture 40 and to transfer the circuit components 46 simultaneously onto the substrate 22 in the appropriate pattern. Regarding the further advantages of the hole 62 mentioned above, reference may now be had to FIG. 6 which illustrates various types of pistons 66a, 66b, and 66c disposed within the respective holes 62. The pistons 66 may be extended to transfer the circuit components 46 from the fixture 40 to the substrate 22, as shown in FIG. 7.

Advantageously, each of the pistons 66a, 66b, and 66c includes a respective port 68a, 68b, and 68c through which a vacuum may be applied to hold the respective circuit components 46a, 46b, and 46c to the piston during the transfer procedure. As illustrated in FIG. 7, the substrate 22 to which the circuit components 46 are to be coupled is placed over the fixture 40. With the vacuum holding the respective circuit components 46 to the end of the respective pistons 66, the pistons move upwardly to place the circuit components 46 onto the substrate 22. Advantageously, the means for moving the pistons 66 are controlled to place the circuit components 46 at the proper height so that multilevel placement of all circuit components 46 may take place substantially simultaneously.

Figure 6:
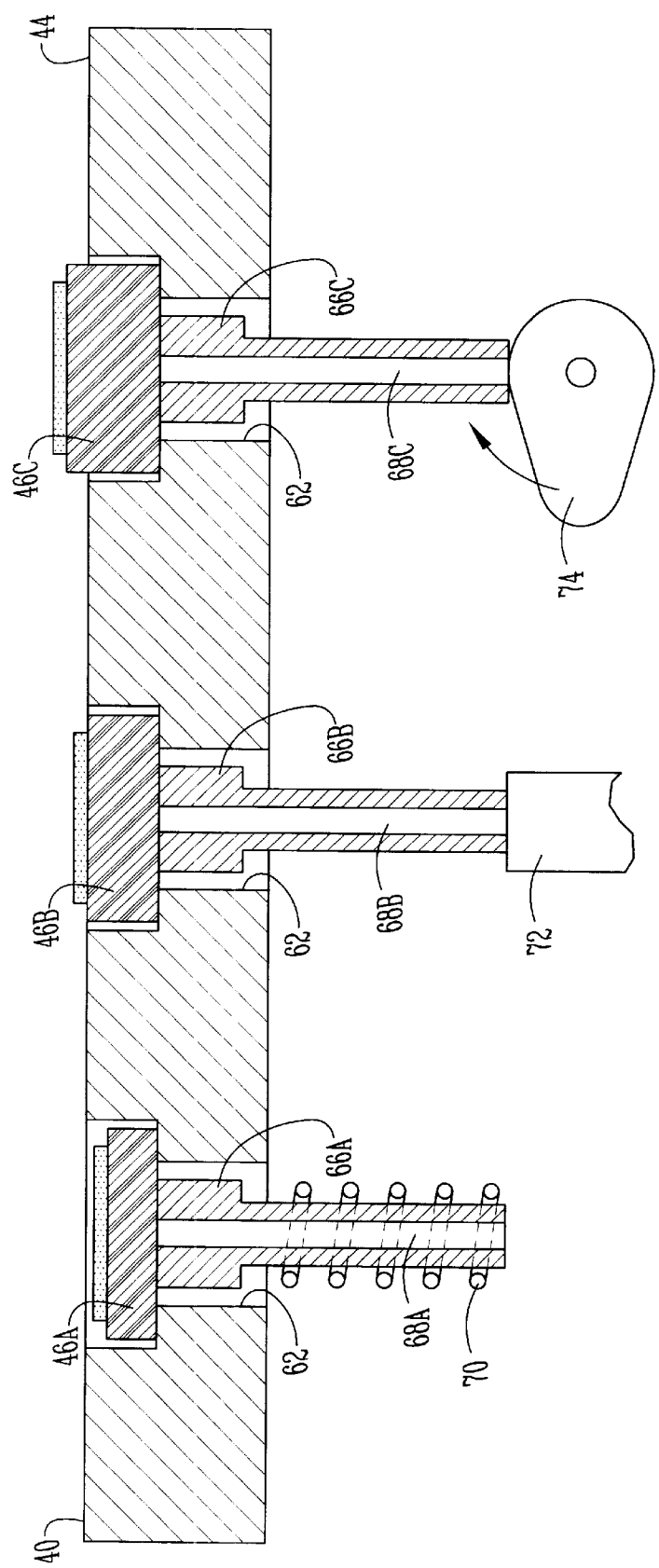
FIG. 6 illustrates the cross-sectional view of FIG. 5 along with three piston-like devices for transferring the chips from the fixture to a substrate.
Figure 7:
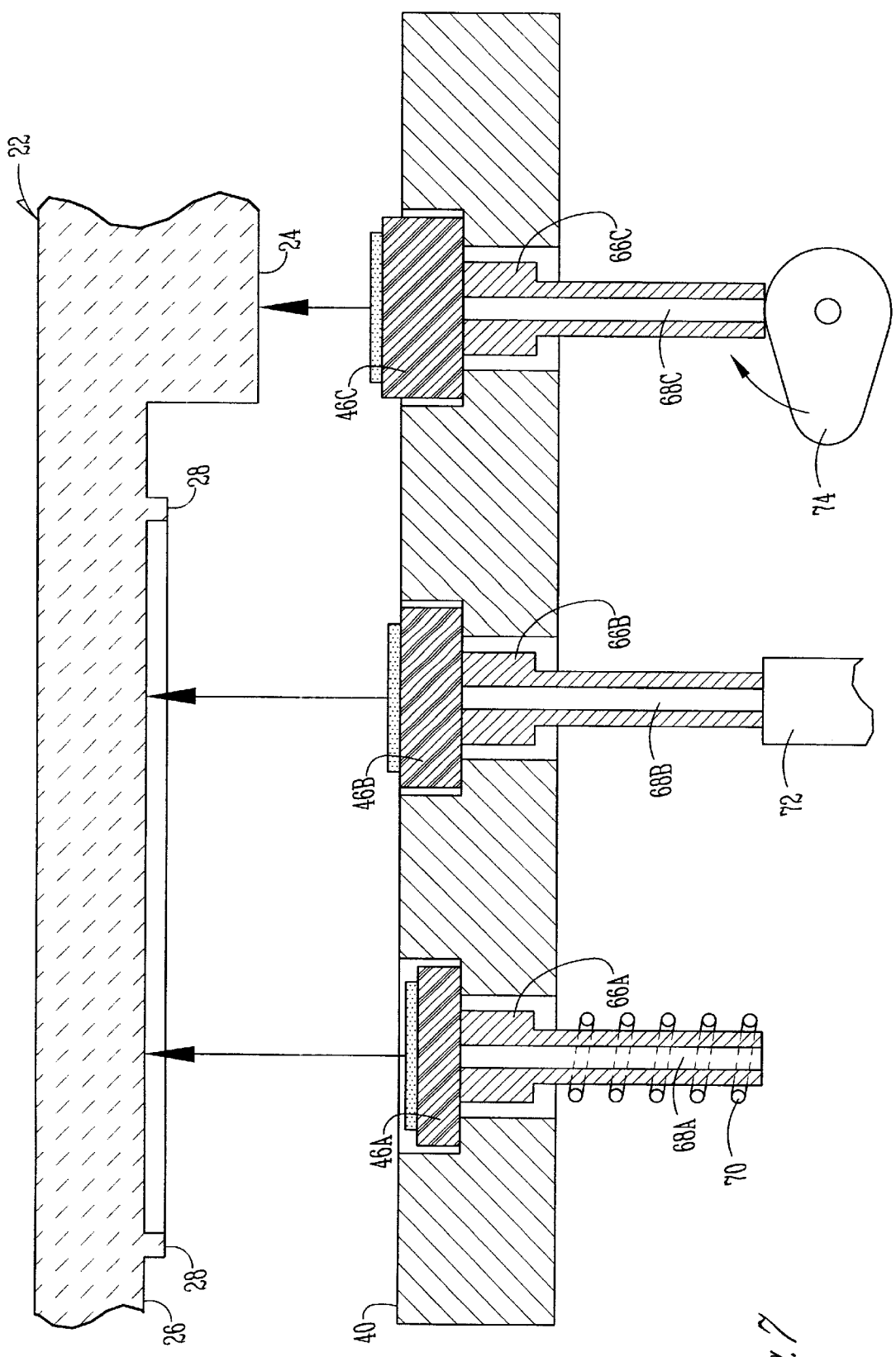
FIG. 7 illustrates the cross-sectional view of FIG. 6 with an exemplary substrate positioned over the fixture.

Although any suitable mechanism may be used for moving the pistons 66 to facilitate transfer of the circuit components 46 from the fixture 40 to the substrate 22, FIGS. 6 and 7 illustrate three different embodiments. First, a spring 70 may be disposed around the piston 66a to move the circuit component 46a into contact with the surface of the substrate 22 at the appropriate time. Second, the piston 66b may be coupled to a solenoid 72, or a similar device, which moves the piston 66b upwardly to transfer the circuit component 46b from the fixture 40 to the surface of the substrate 22. Third, a rotatable cam mechanism 74 may be placed in contact with the opposite end of the piston 66c so that actuation of the cam mechanism 74 from its side lobe to its main lobe raises the piston 66c to facilitate transfer of the circuit component 46c from the fixture 44 to the surface of the substrate 22.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. An apparatus for use in assembling an electronic device comprising:

a fixture having a first surface and a second surface, the first surface having a plurality of holders, each of the plurality of holders adapted to accept a circuit component backside up therein such that the backside of the circuit components are in a substantially coplanar relationship, the holders arranged in a pattern corresponding to a pattern of circuit components on a substrate to facilitate simultaneous transfer of the circuit components from the fixture to the substrate, wherein each of the plurality of holders have a respective hole which extends through the second surface; and a piston slidingly received in each hole adapted for transferring each respective circuit component from the fixture to a substrate.

2. The apparatus, as set forth in claim 1, wherein each hole adapted to supply a vacuum to the respective holder for holding the respective circuit component in the holder.

3. The apparatus, as set forth in claim 1, wherein each of the plurality of holders adapted such that the backside of the circuit component forms a portion of the first surface.

4. The apparatus, as set forth in claim 1, wherein the backside of each circuit component is offset by no more than approximately 0.127 mm (0.005 inches) from the first surface.

5. The apparatus, as set forth in claim 1, wherein the holders are no more than approximately 0.0127 mm (0.0005 inches) larger than the component to be received therein in any linear direction in the plane of the first surface.

6. The apparatus, as set forth in claim 1, wherein each piston has a port adapted to supply a vacuum for holding the respective circuit component.

7. The apparatus, as set forth in claim 1, wherein the fixture is anodized aluminum.

8. The apparatus, as set forth in claim 1, wherein the fixture is conductive plastic.

9. The apparatus, as set forth in claim 1, further comprising a tacky substance in the holders adapted to temporarily hold the circuit component in the respective holder.

10. The apparatus, as set forth in claim 3, further comprising a device adapted to apply adhesive to the backside of each of the circuit components in the fixture.

11. The apparatus, as set forth in claim 10, wherein the device adapted to apply adhesive comprises:
   a screen printer having a screen located over the fixture, the screen having a plurality of holes therein, each hole being located over a respective one of the circuit components to facilitate application of adhesive onto the backside of each circuit component through each respective hole.

12. An apparatus for use in assembling an electronic device comprising:
   a fixture having a first surface and a second surface, the first surface is substantially regular and having a plurality of recesses therein, each of the plurality of recesses adapted to accept a circuit component backside up therein such that the backside of the circuit components are in a substantially coplanar relationship, the recesses arranged in a pattern corresponding to a pattern of circuit components on a substrate to facilitate simultaneous transfer of the circuit components from the fixture to the substrate, wherein each of the plurality of recesses have a respective hole which extends through the second surface; and
   a plurality of pistons, each piston slidedably located within one of the respective holes, each piston adapted for engaging the respective circuit component in the respective recess and for transferring the respective circuit component from the fixture to the substrate surface.

13. The apparatus, as set forth in claim 12, wherein each piston has a port adapted to supply a vacuum to the respective recess for engaging the respective circuit component.

14. The apparatus, as set forth in claim 12, wherein each hole adapted to supply a vacuum to the respective recess for holding the respective circuit component in the recess.

15. The apparatus, as set forth in claim 12, wherein each of the plurality of recesses adapted such that the backside of the circuit component forms a portion of the first surface.

16. The apparatus, as set forth in claim 12, wherein the backside of each circuit component is offset by no more than approximately 0.127 mm (0.005 inches) from the first surface.

17. The apparatus, as set forth in claim 12, wherein the recesses are no more than approximately 0.0127 mm (0.0005 inches) larger than the component to be received therein in any linear direction in the plane of the first surface.

18. The apparatus, as set forth in claim 12, wherein the fixture is anodized aluminum.

19. The apparatus, as set forth in claim 12, wherein the fixture is conductive plastic.

20. The apparatus, as set forth in claim 12, further comprising a tacky substance in the recesses adapted to temporarily hold the circuit component in the respective recess.

21. The apparatus, as set forth in claim 15, further comprising a device adapted to apply adhesive to the backside of each of the circuit components in the fixture.

22. The apparatus, as set forth in claim 21, wherein the device adapted to apply adhesive comprises:
   a screen printer having a screen located over the fixture, the screen having a plurality of holes therein, each hole being located over a respective one of the circuit components to facilitate application of adhesive onto the backside of each circuit component through each respective hole.

* * * * *